(12) United States Patent
Lee

(10) Patent No.: US 10,948,948 B2
(45) Date of Patent: Mar. 16, 2021

(54) MOBILE APPARATUS

(71) Applicant: SAMSUNG ELECTRONICS CO., LTD., Suwon-si (KR)

(72) Inventor: Seung-won Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/791,597

(22) Filed: Feb. 14, 2020

(65) Prior Publication Data

US 2020/0183458 A1   Jun. 11, 2020

Related U.S. Application Data

(63) Continuation of application No. 15/869,954, filed on Jan. 12, 2018, now Pat. No. 10,564,677, which is a
(Continued)

(30) Foreign Application Priority Data

Jan. 3, 2012   (KR) ..................... 10-2012-0000653
Jun. 26, 2012   (KR) ..................... 10-2012-0068704

(51) Int. Cl.
*G06F 1/16* (2006.01)
*H04M 1/02* (2006.01)
(Continued)

(52) U.S. Cl.
CPC .......... *G06F 1/1654* (2013.01); *G06F 1/1601* (2013.01); *G06F 1/1618* (2013.01); *G06F 1/1626* (2013.01); *G06F 1/1632* (2013.01); *G06F 1/1669* (2013.01); *G06F 1/1675* (2013.01); *G06F 1/1681* (2013.01); *G06F 1/1683* (2013.01); *G06F 3/0202* (2013.01);
(Continued)

(58) Field of Classification Search
CPC combination set(s) only.
See application file for complete search history.

(56) References Cited

U.S. PATENT DOCUMENTS 6,845,005 B2    1/2005  Shimano et al.
6,937,468 B2 *  8/2005  Lin ....................... G06F 1/1632
                                                   361/679.41
(Continued)

FOREIGN PATENT DOCUMENTS

CA    2 795 588 A1    9/2011
CA    2810881         9/2011
(Continued)

OTHER PUBLICATIONS

European Search Report dated Jun. 3, 2015 issued in corresponding European Patent Application 12198451.2.
(Continued)

*Primary Examiner* — Lisa Lea-Edmonds
(74) *Attorney, Agent, or Firm* — Staas & Halsey LLP

(57) ABSTRACT

An electronic apparatus includes a first body which includes a keyboard and an adaptor, and a second body which includes a display and a frame in which the display is installed. The first body includes a first magnet, and the second body includes a second magnet. The second body is rotatable with respect to the keyboard of the first body while the first body is attached to the second body.

26 Claims, 12 Drawing Sheets

Related U.S. Application Data continuation of application No. 14/877,369, filed on Oct. 7, 2015, now Pat. No. 9,952,628, which is a continuation of application No. 13/681,679, filed on Nov. 20, 2012, now Pat. No. 9,167,711.

(51) Int. Cl.

| | | |
|---|---|---|
| *H01R 13/62* | (2006.01) | |
| *H05K 7/02* | (2006.01) | |
| *G06F 3/02* | (2006.01) | |
| *H04M 1/04* | (2006.01) | |
| *H01R 35/02* | (2006.01) | |
| *H04M 1/23* | (2006.01) | |

(52) U.S. Cl.
CPC ............ *H04M 1/0254* (2013.01); *H05K 7/02* (2013.01); *H01R 13/6205* (2013.01); *H01R 35/025* (2013.01); *H01R 2201/06* (2013.01); *H04M 1/04* (2013.01); *H04M 1/23* (2013.01)

(56) References Cited

U.S. PATENT DOCUMENTS

| | | | |
|---|---|---|---|
| 7,332,990 B2 | 2/2008 | Lo et al. | |
| 7,541,907 B2* | 6/2009 | Wang | G06F 1/1632 335/214 |
| 7,583,500 B2* | 9/2009 | Ligtenberg | G06F 1/1616 361/147 |
| 7,659,888 B2* | 2/2010 | Kyouzuka | G06F 1/1679 345/173 |
| 7,966,040 B2 | 6/2011 | Kim et al. | |
| 8,143,983 B1* | 3/2012 | Lauder | G06T 1/00 335/219 |
| 8,390,412 B2* | 3/2013 | Lauder | H01F 7/04 335/219 |
| 8,467,183 B2* | 6/2013 | Probst | G06F 1/1654 361/679.55 |
| 8,472,186 B2* | 6/2013 | Probst | G06F 1/1616 361/679.55 |
| 8,519,962 B2* | 8/2013 | Han | G06F 1/1683 345/169 |
| 8,599,542 B1* | 12/2013 | Healey | G06F 1/1626 361/679.17 |
| 8,633,867 B2* | 1/2014 | Kim | G06F 3/0412 345/1.1 |
| 9,167,711 B2* | 10/2015 | Lee | G06F 1/1626 |
| 9,591,904 B2* | 3/2017 | Park | A45C 11/00 |
| 9,740,238 B2* | 8/2017 | Han | G06F 1/1683 |
| 9,952,628 B2* | 4/2018 | Lee | G06F 1/1618 |
| 10,564,677 B2* | 2/2020 | Lee | G06F 1/1601 |
| 10,671,121 B2* | 6/2020 | Zhu | H01R 24/66 |
| 10,671,126 B2* | 6/2020 | Wang | G06F 1/1656 |
| 2004/0209489 A1 | 10/2004 | Clapper | |
| 2006/0262496 A1* | 11/2006 | Lee | G06F 1/1681 361/679.27 |
| 2008/0024975 A1 | 1/2008 | Huang et al. | |
| 2010/0238620 A1 | 9/2010 | Fish | |
| 2010/0321877 A1* | 12/2010 | Moser | G06F 1/1616 361/679.29 |
| 2011/0080326 A1 | 4/2011 | Won et al. | |
| 2011/0086681 A1 | 4/2011 | Ladoucheur et al. | |
| 2011/0096513 A1 | 4/2011 | Kim | |
| 2011/0170252 A1 | 7/2011 | Jones et al. | |
| 2011/0199726 A1* | 8/2011 | Moser | G06F 1/1616 361/679.09 |
| 2011/0292584 A1 | 12/2011 | Hung et al. | |
| 2012/0176746 A1 | 7/2012 | Chen et al. | |
| 2012/0194448 A1 | 8/2012 | Rothkopf | |
| 2013/0039000 A1* | 2/2013 | Vicente, Jr. | G06F 1/1681 361/679.41 |
| 2013/0170126 A1* | 7/2013 | Lee | G06F 1/1681 361/679.17 |
| 2013/0178155 A1 | 7/2013 | Shulenberger | |
| 2013/0178161 A1 | 7/2013 | Shulenberger | |
| 2013/0201646 A1 | 8/2013 | Braun | |
| 2014/0035511 A1 | 2/2014 | Ferber et al. | |
| 2014/0211380 A1* | 7/2014 | Tsai | G06F 1/1681 361/679.01 |
| 2014/0211445 A1* | 7/2014 | Hirai | G06F 1/1654 361/809 |
| 2016/0026221 A1* | 1/2016 | Lee | G06F 1/1632 361/679.29 |
| 2017/0269634 A1* | 9/2017 | Ji | H01F 7/0263 |
| 2018/0136697 A1* | 5/2018 | Lee | G06F 1/1681 |
| 2018/0196473 A1* | 7/2018 | Smith | G06F 1/1656 |
| 2020/0089276 A1* | 3/2020 | Zhu | G06F 1/1662 |
| 2020/0089285 A1* | 3/2020 | Gilbert | G06F 1/1632 |
| 2020/0183458 A1* | 6/2020 | Lee | G06F 1/1675 |

FOREIGN PATENT DOCUMENTS

| | | |
|---|---|---|
| EP | 1 791 050 A2 | 5/2007 |
| EP | 2 671 133 A1 | 12/2013 |
| JP | 2005-39019 | 2/2005 |
| WO | 2011/038686 A1 | 4/2011 |

OTHER PUBLICATIONS

U.S. Notice of Allowance dated May 22, 2015 in related U.S. Appl. No. 13/681,679.
U.S. Office Action dated Dec. 5, 2014 in related U.S. Appl. No. 13/681,679.
U.S. Notice of Allowance dated Aug. 15, 2014 in related U.S. Appl. No. 13/681,679.
Supplemental Notice of Allowability dated Sep. 16, 2015 in related U.S. Appl. No. 13/681,679.
European Office Action dated Jun. 22, 2016 in corresponding European Patent Application No. 12 198 451.2.
European Communication Summons to attend oral proceedings pursuant to Rule 115(1) EPC cited in Application No. 12198451.2 dated Feb. 20, 2017 (9 pages).
European Patent Office Decision to refuse a European Patent Application issued in European Patent Application No. 12 198 451.2 dated Nov. 6, 2017 (26 pages).
European Patent Office Provision of the minutes in accordance with Rule 124(4) EPC issued in European Application No. 12 198 451.2 dated Nov. 2, 2017 (15 pages).
Korean Patent Office Action issued in Korean Patent Application No. 10-2012-0068704 dated Oct. 30, 2017 (total of 8 pages).
Office Action dated Jan. 3, 2017 in co-pending U.S. Appl. No. 14/877,369 (23 pages).
Notice of Allowance Action dated Jul. 21, 2017 in co-pending U.S. Appl. No. 14/877,369 (14 pages).
Notice of Allowance Action dated Nov. 14, 2017 in co-pending U.S. Appl. No. 14/877,369 (19 pages).
Corrected Notice of Allowance Action dated Jan. 12, 2018 in co-pending U.S. Appl. No. 14/877,369 (9 pages).
Office Action dated Aug. 29, 2018 in related U.S. Appl. No. 15/869,954.
Office Action dated May 3, 2019 in related U.S. Appl. No. 15/869,954.
Notice of Allowance dated Jan. 17, 2019 in related U.S. Appl. No. 15/869,954.
Notice of Allowance dated Oct. 15, 2019 in related U.S. Appl. No. 15/869,954.
Notice of Allowance dated Dec. 30, 2019 in related U.S. Appl. No. 15/869,954.
European Office Action dated Oct. 4, 2019 in related European Patent Application No. 18 151 290.6.
U.S. Appl. No. 15/869,954, filed Jan. 12, 2018, Seung-Won Lee, Samsung Electronics Co., Ltd.
U.S. Appl. No. 14/877,369, filed Oct. 7, 2015, Seung-Won Lee, Samsung Electronics Co., Ltd.
U.S. Appl. No. 13/681,679, now issued as U.S. Pat. No. 9,167,711, filed Nov. 20, 2012, Seung-Won Lee, Samsung Electronics Co., Ltd.

\* cited by examiner

MOBILE APPARATUS

CROSS-REFERENCE TO RELATED APPLICATIONS

This application is a Continuation of U.S. patent application Ser. No. 15/869,954, filed on Jan. 12, 2018, which is a Continuation of U.S. patent application Ser. No. 14/877,369, filed on Oct. 7, 2015, which is a Continuation of U.S. patent application Ser. No. 13/681,679, filed on Nov. 20, 2012, which claims priority benefit of Korean Patent Application No. 10-2012-0068704, filed on Jun. 26, 2012, and Korean Patent Application No. 10-2012-0000653, filed Jan. 3, 2012, the disclosures of which are incorporated herein in their entirety by reference.

BACKGROUND

1. Field

The present general inventive concept relates to a mobile apparatus in which two bodies are detachably attached to each other.

2. Description of the Related Art

A mobile apparatus, that is, a portable mobile apparatus, such as a notebook computer, includes a display unit for transferring information via vision and a manipulation unit for manipulating the mobile apparatus. The display unit and the manipulation unit are installed on two bodies, respectively. By tilting the two bodies, the manipulation unit, the display unit, or both of them may be converted into a use state in that a user can use the mobile apparatus or a pause state for movement and accommodation of the mobile apparatus.

With regard to a notebook computer, two bodies are coupled to each other via a fixed-type hinge structure, and thus, the two bodies cannot be separated from each other. Recently, as usable tablet computers have become popular, it is necessary to provide a method of detaching or mounting a tablet computer from or on a body including a manipulation unit as an input function of the tablet computer.

SUMMARY

The present general inventive concept provides a mobile apparatus that is used in various forms by connecting two detachable bodies.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a mobile apparatus including a first body, a second body, a rotary adaptor including an accommodation portion to accommodate the second body, rotatably installed on the first body, and to move the second body to a position where the second body is stacked on the first body and a position where the second body is unfolded, first magnets disposed on the accommodation portion, and second magnets disposed on the second body so as to face the corresponding first magnets and having different polarity from the corresponding first magnets.

The mobile apparatus may further include a first electric contact portion disposed on the accommodation portion, and a second electric contact portion disposed on the second body to be connected to the first electric contact portion when the second body is mounted on the rotary adaptor, wherein the first magnets and the second magnets are disposed at both sides of the first electric contact portion and both sides of the second electric contact portion.

The second body may have a long side portion and a short side portion, and the second electric contact portion and the second magnets may be disposed on at least one of the long side portion and the short side portion.

The mobile apparatus may further include third magnets that have the same polarity as one of the first magnets and the second magnets, are disposed on one of the second body and the rotary adaptor, and align the second body such that the first magnets and the second magnets are coupled with each other due to a magnetic repulsive force between the third magnets and one of the first magnets and the second magnets.

One of the first electric contact portion and the second electric contact portion may include a first terminal unit and a second terminal unit, which have symmetrical terminal arrangements.

The first electric contact portion and the second electric contact portion may be connected to each other when the first magnets and the second magnets are coupled with each other.

The mobile apparatus may further include a protrusion disposed on one of the rotary adaptor and the second body, a support disposed on the other one of the rotary adaptor and the second body so as to support the protrusion and separating the first electric contact portion and the second electric contact portion from each other, and a concave portion disposed in the support such that the protrusion is inserted into the concave portion when the first magnets and the second magnets are coupled with each other to connect the first electric contact portion and the second electric contact portion to each other.

At least one of the first magnets and the second magnets may be an electromagnet.

The second body may be a tablet computer. The first body may perform at least one function of functions of an auxiliary input device, a power supply device, and a charging station of the tablet computer.

The first body may be a main body of a portable computer, and the second body may include a display unit that is connected to the main body and displays an image.

The foregoing and/or other features and utilities of the present general inventive concept may also be achieved by providing a mobile apparatus including a body having a display screen, and having a frame with a first surface having an opening to expose the display screen, a second surface disposed opposite to the first surface, and a side portion disposed between the first and second surfaces and the rear surface and having one or more magnets disposed in the side portion of the frame of the first body.

The body may include another one or more magnets disposed in the side portion of the frame opposite to the one or more magnets with respect to the display screen.

The side portion of the frame may include one or more pairs of sides disposed opposite to each other with respect to the display screen, and the magnets may be disposed both sides of the side portion of the frame.

The side portion of the frame may include comprises one or more recesses to accommodate the corresponding magnets.

The side portion of the frame may include one or more recesses and one or more non-recesses, and the magnets may be disposed in the corresponding recesses such that the non-recesses and outside surface of the magnets form an outside surface of the side portion of the frame.

The magnets may not protrude from an outside surface of the side portion of the frame.

The magnets may have a width narrower than a thickness of the side portion of the body.

The magnets may have a length longer than a thickness of the side portion of the body between the first surface and the second surface The magnets may have a thickness in a direction parallel to the display screen thinner than a width of the magnets in a thickness direction of the side portion of the body.

The body may include an electric contact portion disposed in the side portion of the frame and exposed from the side portion of the frame, and the electric contact portion may include a first terminal for a power supply and a second terminal for a signal transmission.

The one or more magnets may be disposed apart from each other by a distance, and the body may include a processor disposed in the frame and an electric contact portion disposed in the side portion of the frame and connected to the processor.

The body may include an electric contact portion exposed through the side portion of the frame, and the electric contact portion comprises a first terminal set having terminals arranged in a first direction and a second terminal set having the terminals arranged in a second direction opposite to the first direction.

The body may include a processor and an electric contact portion connected to the processor, and the electric contact portion may include two sets of same terminals arranged in different orders.

The body may include an electric contact portion disposed between the magnets, and the electric contact portion may include two sets of same terminals arranged along the side portion of the frame or arranged parallel to each other in the side portion of the frame.

The foregoing and/or other features and utilities of the present general inventive concept may also be achieved by providing a mobile apparatus including a body having a frame, and a rotary adaptor rotatably coupled to the frame, the rotary adaptor having an accommodation portion to receive an external body and one or more magnets disposed in a bottom of the accommodation portion of the rotary adaptor.

The rotary adaptor may include an accommodation portion with a first portion, a second portion, and a third portion to provide a space to receive an external body.

The first portion and third portion may be spaced apart from each other by a width to correspond to a width of the second portion, and the magnets may be disposed in the second portion.

The second portion may have a thickness; and the magnets may be disposed in the second portion.

The rotary adaptor may include an inlet portion extended from the accommodation portion to be rotatably coupled to the frame of the body.

The accommodation portion and the inlet portion may be disposed in a direction parallel to a major surface of the keyboard.

The rotary adaptor may include an electric contact portion disposed between the magnets.

The frame may have a keyboard.

The foregoing and/or other features and utilities of the present general inventive concept may also be achieved by providing a mobile apparatus including a first body having a first frame with a keyboard, and having a rotary adaptor rotatably coupled to the frame, the rotary adaptor having an accommodation portion to receive an external body and one or more first magnets disposed in a bottom of the accommodation portion of the rotary adaptor, and a second body having a display screen, and having a second frame with a first surface having an opening to expose the display screen, a second surface disposed opposite to the first surface, and a side portion disposed between the first and second surfaces and the rear surface and having one or more second magnets disposed in the side portion of the frame of the first body to correspond to the magnets of the rotary adaptor of the first body.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION

Figure 1:
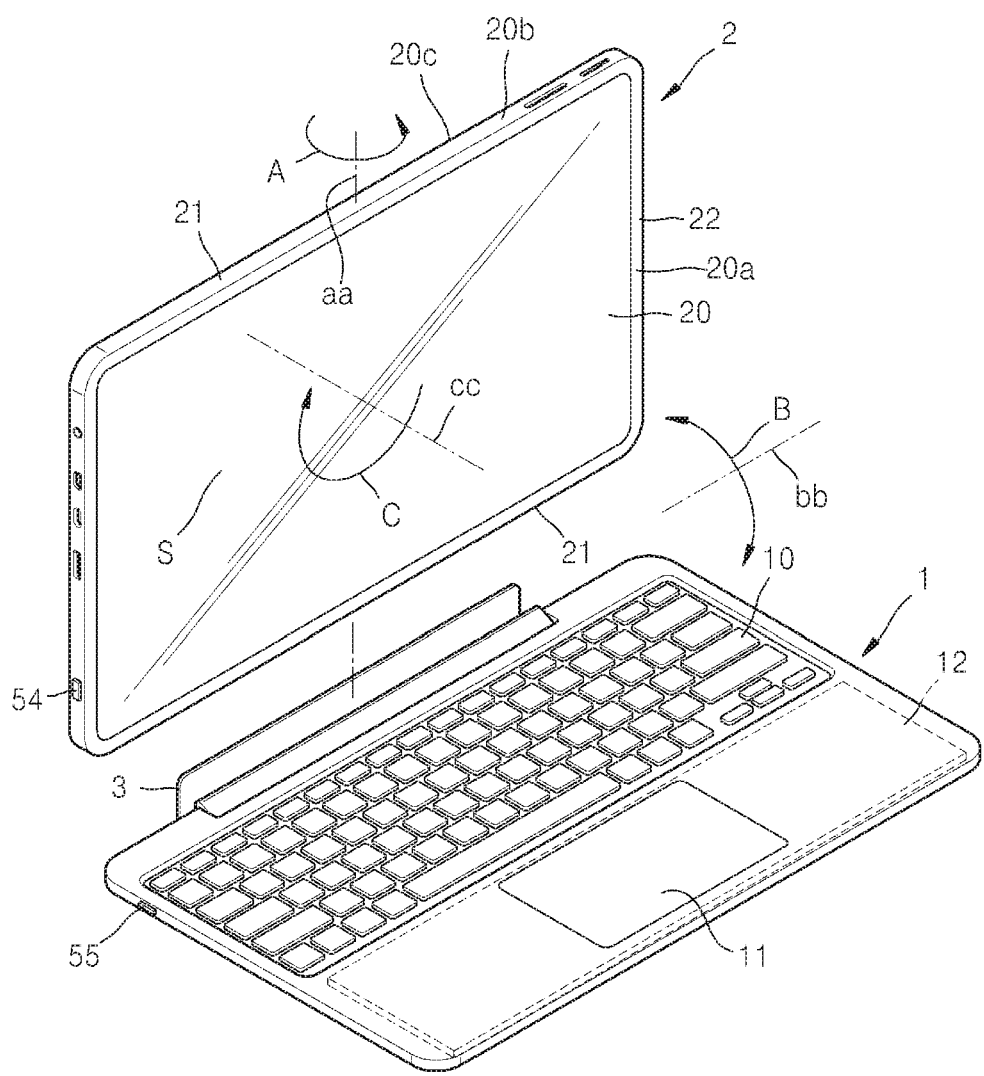
FIG. 1 is an exploded perspective view illustrating a mobile apparatus in a state where a second body is separated from a first body, according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

FIGS. 1 through 4 are perspective views illustrating a mobile apparatus according to an embodiment of the present general inventive concept. Referring to FIG. 1, the mobile apparatus includes a first body 1 and a second body 2. The first body 1 and the second body 2 may be detachably attached to each other. The second body 2 may be separately carried from the first body 1.

The mobile apparatus may be, for example, a portable computer. In this case, the first body 1 may be a body of a portable computer, for example, a notebook computer including a processor and a memory. The first body 1 may include a keyboard 10, a pointing device 11, and a power supply including a battery 12 to receive an external power and to store the power in battery cells such that the external or stored power can be used in the mobile apparatus and/or the first and second bodies 1 and 2. In addition, the first body 1 may include various input components including one or more processors as controller or functional units to manipulate the mobile apparatus and to perform functions of the mobile apparatus. The second body 2 may include a display unit 20 to display an image on a screen S. The display unit 20 may be, for example, a liquid crystal display device, a flat display device including an organic light-emitting device, or the like. The display unit 20 may include a touch screen panel with the screen S to output an image as a display unit and to input data or user commands as a keyboard. It is possible that the second body may perform functions of the first body 1 of the mobile apparatus when the first body 2 of the mobile apparatus is connected to the second body 2 through a wired or wireless method. Although not illustrated in FIGS. 1 through 4, the first body 1 and/or the second body 2 may include a speaker to output a sound. In addition, the first body 1 and/or the second body 2 may include various standards of input/output ports (not illustrated) to input and output an audio signal, to input and output an image signal, and to connect the mobile apparatus to an external device, and a power supply inlet/outlet (not illustrated) to receive the external power from an external device as an external power source.

The second body 2 may be a tablet computer. The second body 2 may include one or more processors to manipulate the second body 2 and/or to perform one or more functions of the second body 2 and/or the mobile apparatus, and a power supply including a battery (not illustrated) to receive an external power and to store the power in battery cells such that the external power or stored power can be used in the second body 2 or the mobile apparatus or can be used to drive the one or more processors, a memory to store data such that the one or more processors can process data according to the data stored in the memory, data received from the first body 1 or data received from an external apparatus, and the display unit 20 including a screen S to provide an image to a user. The screen S may be a touch screen to provide an image and to receive a user data or command. The second body 2 may include a communication module that may communicate with an external device or apparatus via a wireless or wire/wireless communication method. In this case, the first body 1 may be a docking station that functions as an auxiliary input device, a power supplying device, a charging station, and/or the like of a tablet computer. The first body 1 may include the keyboard 10, the pointing device 11, and the battery 12. In this case, the first body 1 and/or the second body 2 may include a speaker, various standards of input/output ports (not illustrated), and a power supply inlet/outlet (not illustrated) to receive and supply power.

The second body 2 may have a first (front) surface 20a having an opening to expose the screen S of the display unit 20, a third (rear) surface 20c, and a side surface (side portion) 20b disposed or formed between the first surface 20a and the second surface 20c to provide a thickness of the second body 2. The second body 2 may rotate in a direction A, B, or C with respect to the first body 1 or a reference axis aa, bb, or cc.

Figure 2:
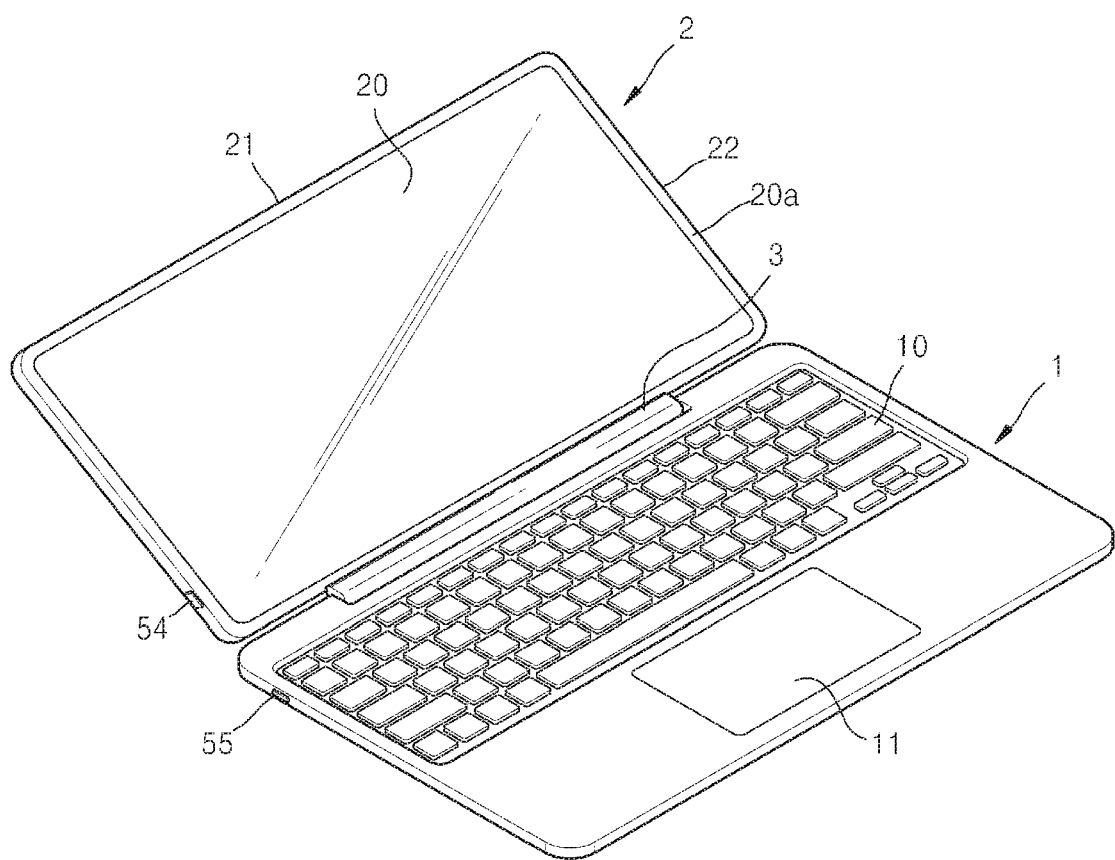
FIG. 2 is a perspective view illustrating a mobile apparatus in a state where a second body is coupled with a rotary adaptor and is inclined with respect to the first body, according to an embodiment of the present general inventive concept.

The second body 2 may be coupled with the first body 1. The mobile apparatus may include a rotary adaptor 3 which may be provided in or installed on the first body 1 to accommodate the second body 2. The rotary adaptor 3 may be rotatably installed on the first body 1. As illustrated in FIG. 2, the second body 2 may be coupled with the rotary adaptor 3. In this state, when a user pushes or pulls the second body 2 to rotate the rotary adaptor 3 in the direction B, the second body 2 rotates with respect to the first body 1 at a predetermined angle in the direction B.

Figure 3:
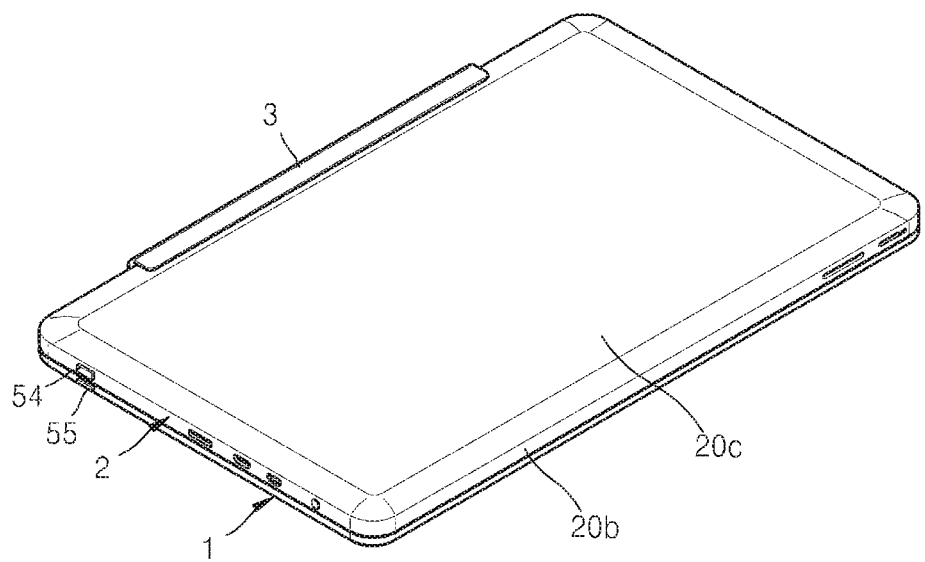
FIG. 3 is a perspective view illustrating a mobile apparatus in a state where a second body is stacked on a first body according to an embodiment of the present general inventive concept.

When the user does not use the mobile apparatus, the user may completely stack the second body 2 on the first body 1 in a folding state from an unfolding state, as illustrated in FIG. 3. The folding state and the unfolding state may be either one of an operable state and an inoperable state.

Figure 4:
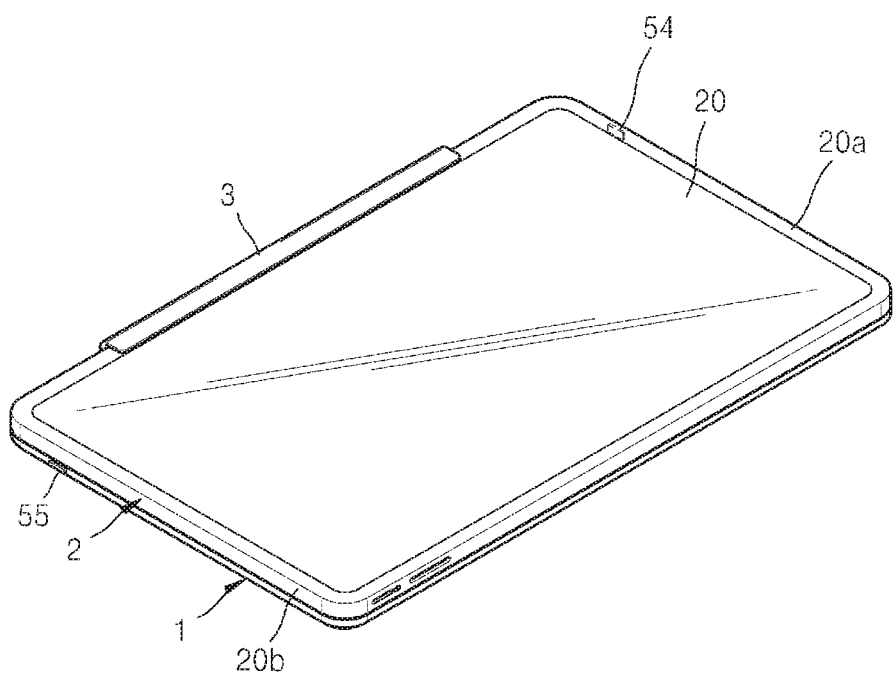
FIG. 4 is a perspective view illustrating a mobile apparatus in a state where a second body is stacked on a first body so that a display unit is positioned upward according to an embodiment of the present general inventive concept.
Figure 5:
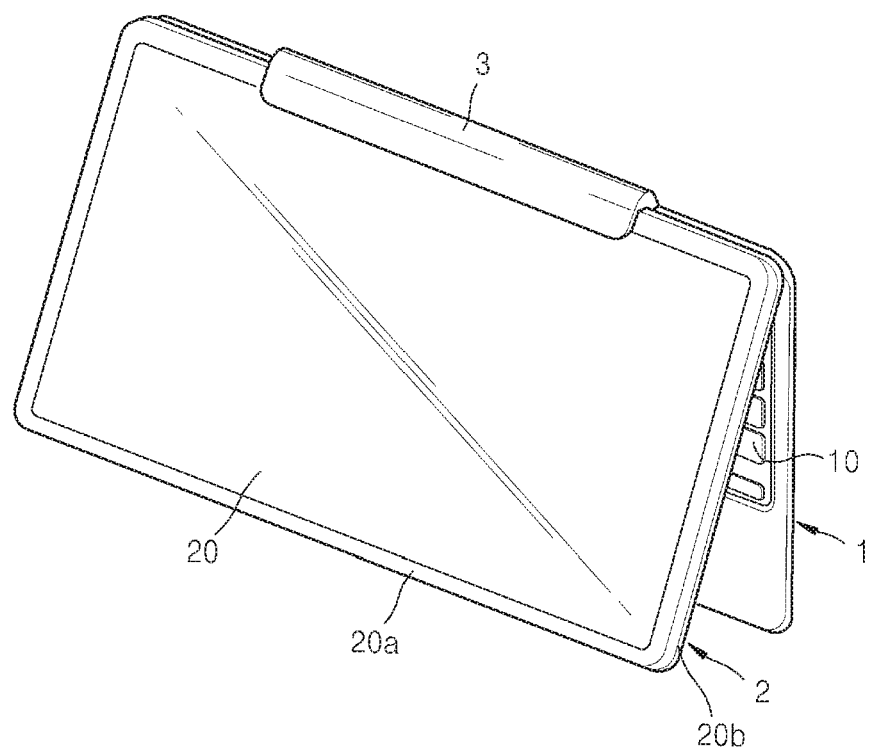
FIG. 5 is a perspective view illustrating a mobile apparatus in a state where first and second bodies are disposed on a reference surface to be in a usable state, according to an embodiment of the present general inventive concept.

As illustrated in FIG. 1, the user may rotate the second body 2 in a direction A at 180 degrees to couple the second body 2 with the rotary adaptor 3, and may rotate the second body 2 in a direction B to stack the second body 2 on the first body 1. Thus, as illustrated in FIG. 4, the display unit 20 may be exposed to an outside of the mobile apparatus in a folding state. In this case, the folding state of the mobile apparatus may be in an operable state. The user may rotate the second body 2 with respect to the first body 1 in the direction B at a predetermined angle to an unfolding state such that the unfolded state of the first and second bodies 1 and 2 can also be in the operable state as illustrated in FIG. 5.

Figure 6:
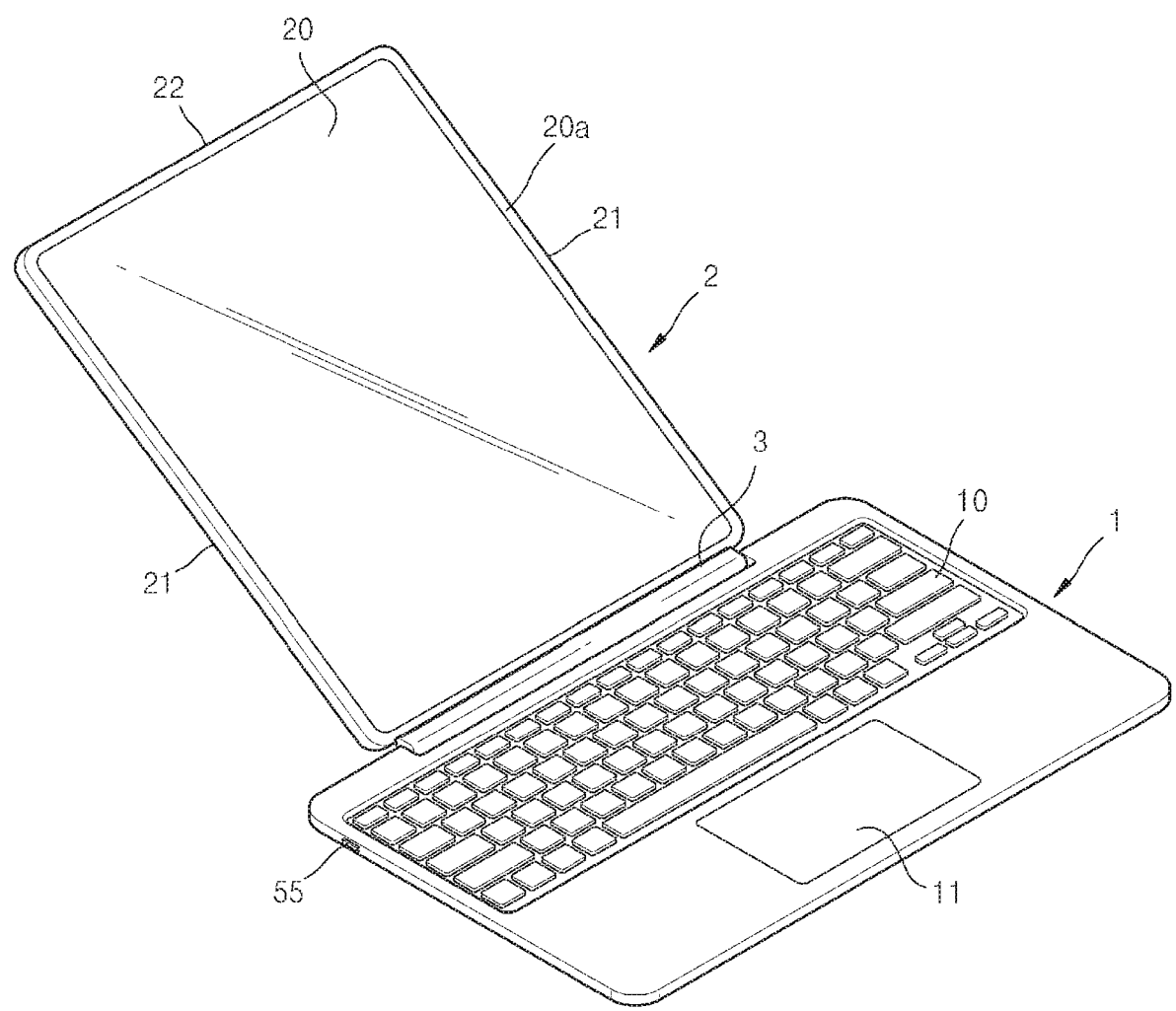
FIG. 6 is a perspective view illustrating a mobile apparatus in a state where a short side portion of a second body is coupled with a rotary adaptor, according to an embodiment of the present general inventive concept.

The second body 2 may have a rectangular shape and may have a long side portion 21 and a short side portion 22 in the side surface 20b. In this case, when a user does not rotate the second body 2 in a direction C of FIG. 1, the long side portion 21 of the side surface 20b of the second body 2 may be coupled with the rotary adaptor 3 as illustrated in FIG. 2. As illustrated in FIG. 6, the short side portion 22 of the second body 2 may be coupled with the rotary adaptor 3 when the second body 2 rotates in the direction C of FIG. 1. The long side portion 21 and the short side portion 22 may have a first length and a second length. The first length and the second length may be different. However, it is possible that the first length and the second length may be same.

Although FIG. 6 illustrates that the rotary adaptor 3 has a length to correspond to the second length of the short side portion 22 of the second body 2, the present general inventive concept is not limited thereto. It is possible that the rotary adaptor 3 may have a length to correspond to the first length of the long side portion 21 of the second body 2 such that the rotary adaptor 3 can accommodate either one of the long side portion 21 and the short side portion 22 of the second body 2.

Figure 7:
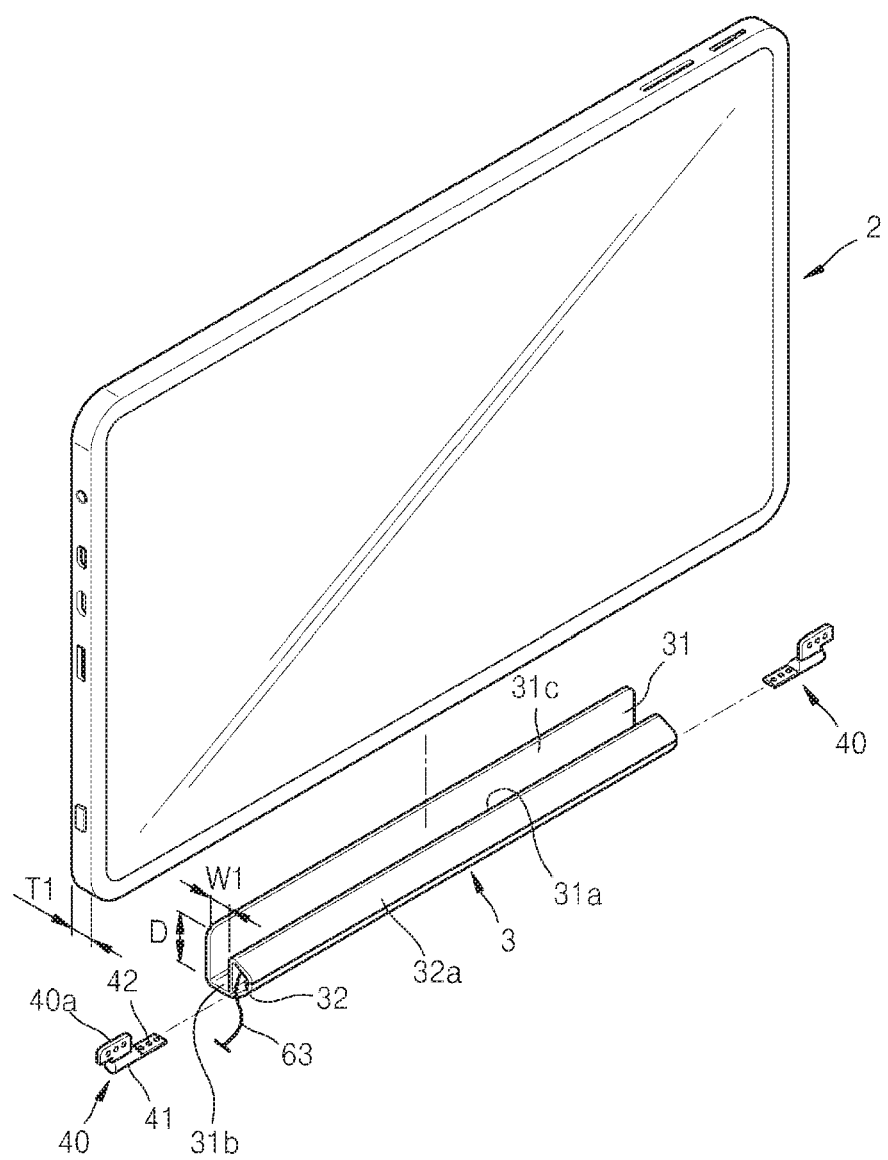
FIG. 7 is an exploded perspective view illustrating a coupling relationship between a rotary adaptor and a second body according to an embodiment of the present general inventive concept.

FIG. 7 is an exploded perspective view illustrating a coupling relationship between the rotary adaptor 3 and the first body 1 and the second body 2 of the mobile apparatus. Referring to FIG. 7, the rotary adaptor 3 may include an accommodation portion 31 to accommodate the second body 2. For example, the accommodation portion 31 may have a "U" shape portion so that the second body 2 may be inserted into the U shape portion of the accommodation portion 31, and the accommodation portion 31 may have a width W1 so as to accommodate a thickness T1 of the second body 2. In order to secure accommodation portion 31 and the second body 2, it is sufficient to determine a depth D of the accommodation portion 31 as long as the second body 2 may not fall down or apart from a coupling state while being accommodated in the accommodation portion 31. The width W1 of the accommodation portion 31 may be determined so that the second body 2 may not move excessively in a width direction while being inserted into the accommodation portion 31.

The "U" shape portion of the accommodation portion 31 may have a first portion 31a, a second portion 31b, and a third portion 31c. The first portion 31a and the third portion 31c are spaced apart from each other by the width W1 and have heights to correspond to the depth D. It is possible that one of the heights of the first portion 31a and the third portion 31c can be longer than the other one of the heights of the first portion 31a and the second portion 31c. For example, the height of the third portion 31c is longer than the height of the first portion 31a. Although FIG. 7 illustrate that the depth D corresponds to the height of the third portion 31c, it is possible that the depth D can correspond to the height of the first portion 31a. In this case, a portion of the height of the third portion 31c higher than the depth or the height of the first portion 31a may be used to additionally support the second body 2 with respect to the rotary adaptor 3 and/or the first body 1 of the mobile apparatus in the coupling state. The second portion 31b of the accommodation portion 31 may be used as a bottom of the accommodation portion 31 to correspond to the width W1 of the accommodation portion 31 and/or the thickness T1 of the second body 2.

The first portion 31a, the second portion 31b, and the third portion 31c of the accommodation portion 31 may be formed in a single integrated or monolithic body and may have a strength enough to support the coupling state, the rotation state, and the operation state of the second body 2, the first body 1, and/or the rotary adaptor 3. The first portion 31a and the third portion 31c may be extended from the second portion 31b at both ends thereof in the direction parallel to the axis aa of FIG. 1. The first portion 31a, the second portion 31b, and the third portion 31c of the accommodation portion 31 may be formed and extended in a lengthwise parallel to the direction bb of FIG. 1. It is possible that the accommodation portion 31 may have a reinforcement element (not illustrated) formed on at least one of the first portion 31a, the second portion 31b, and the third portion 31c in a direction corresponding to the axis bb of FIG. 1 or in a direction formed along surfaces of the first portion 31a, the second portion 31b, and the third portion 31c. The reinforcement element may provide an additional strength to the accommodation portion 31 to support the coupling state, the rotation state, and the operation state of the second body 2, the first body 1, and/or the rotary adaptor 3.

The first body 1 may include hinge portions 40 each having a coupling portion 40a and a rotary shaft 41. The coupling portion 40a of the hinge portions 40 may be fixedly mounted on the first body 1, and the rotary shaft 41 may be rotatably mounted in the corresponding hinge portion 40 such that the rotary shaft 41 can rotate with respect to the coupling portion 40a of the hinge portion 40 and/or the first body 1. The hinge portion 40 may include a rotary prevention portion 42 formed on, extended from, or coupled to the rotary shaft 41 such that the hinge portion 40 can be connected between the first body 1 and the rotary adaptor 3 through the coupling portion 40a, the rotary shaft 41 and/or the rotary prevention portion 41. Although not illustrated in FIG. 7, the hinge portion 40 includes a rotation resistance providing component to provide a rotation resistance force to the rotary shaft 41 with respect to the hinge portion 40. The rotation resistance providing component may apply a rotation resistance force to the rotary shaft 41 by combining an elastic member and a friction washer, for example. Since the hinge portion 40 may be well known, a detailed description thereof is omitted herein.

Figure 8:
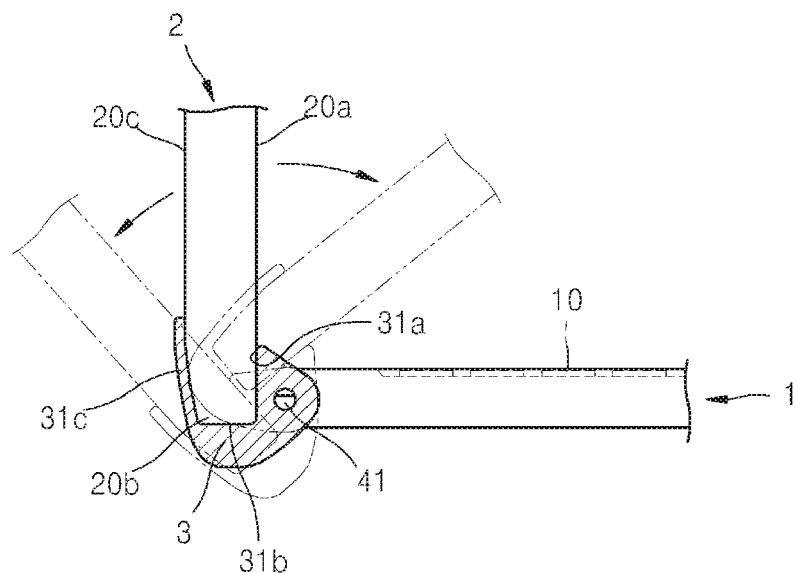
FIG. 8 is a side cross-sectional view illustrating a mobile apparatus in a state where a second body is coupled with a rotary adaptor to be rotatable with respect to a first body, according to an embodiment of the present general inventive concept.

It is possible that one end of the hinge portion 40 can be coupled to a portion of the first body 1. That is, the one end of the hinge portion 40 can be coupled to a side portion of the first body 1. However, it is also possible that the one end of the hinge portion 40 can be coupled an upper portion of the first body 1. It is also possible that the first body 1 may have a side to provide a recess to accommodate the hinge portions 40 and the coupling and rotation of the second body 2 with the respect to the rotary adaptor 3 and the first body 1, and that the hinge portions 40 may be coupled to both ends of the side of the first body 1 such that the accommodation portion 31 and the inlet portion 32a of the rotary adaptor 3 can be disposed to rotate with respect to the first body 1 in the direction B of FIG. 1 without interrupting any portion of the first body 1. The second body 2 may rotate in the direction B around a distal end of a side of the first body 1, as illustrated in FIG. 8.

The rotary adaptor 3 may include an insertion inlet 32 into which the rotary shaft 41 is inserted. The rotary adaptor 3 may include an inlet portion 32a to form the insertion inlet 32. The inlet portion 32a may be extended from the first portion 31a to provide a space to accommodate an electrical connection between the first body 1 and the second body 2, for example, an electric signal line 63 and also to provide a space to receive the hinge portion 40. The rotary shaft 41 may be coupled with the rotary adaptor 3 via a coupler, for example, a screw or the like. It is possible that the rotary shaft 41 may be inserted into the insertion inlet 32 via a press fitting method. For example, the rotation prevention portion 42 may be formed on an end of the rotary shaft 41 so that the rotary shaft 41 may not rotate in the insertion inlet 32. The rotation prevention portion 42 may be, for example, a D-cut portion that has a "D" shape cross section and is formed by partially surface-processing an end of the rotary shaft 41 having a circular cross section. Correspondingly, the insertion inlet 32 of the rotary adaptor 3 may have similar shape to or the same shape as the rotation prevention portion 42.

By using the above-described structure, the second body 2 may be coupled with the first body 1 by inserting the long side portion 21 or the short side portion 22 of the second body 2 into the accommodation portion 31 of the rotary adaptor 3. The first body 1 and the second body 2 can be rotatable about an axis of the rotary shaft 41 as illustrated in FIG. 8. In this state, by pushing or pulling the second body 2 and rotating the rotary adaptor 3 with respect to the first body 1, an inclination angle of the second body 2 with respect to the first body 1 may be adjusted. As illustrated in FIG. 3, the second body 2 may completely stack on the first body 1 in a folded state.

It is necessary to maintain a state in which the second body 2 is coupled with the rotary adaptor 3. To this end, the mobile apparatus according to the present embodiment may include a coupler to couple the second body 2 with the rotary adaptor 3. A coupling method may be a method using shapes of the second body 2 and the rotary adaptor 3, such as a snap-fit method or the like. However, a method using a shape may affect an outer appearance of the second body 2 and a structural addition or change may affect an exterior design of the second body 2. When the second body 2 is capable of being independently usable as a tablet computer, the structural addition or change is determined according to a user or manufacturer preference to maintain or improve the exterior design of the second body 2 or may minimize affecting on an outer appearance of the second body 2.

Figure 9:
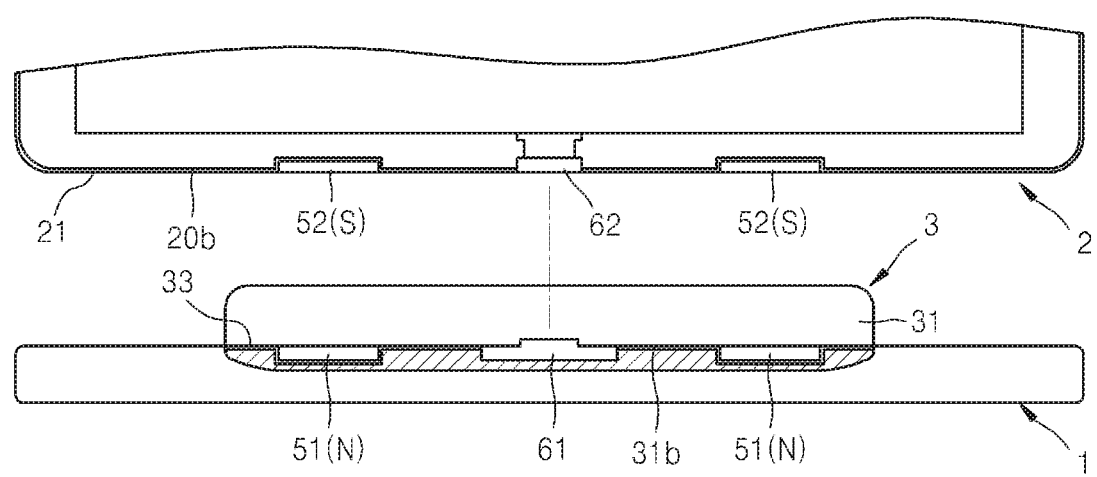
FIG. 9 is a cross-sectional view illustrating a coupler to couple a second body to a rotary adaptor by using a magnetic force, according to an embodiment of the present general inventive concept.

Accordingly, the coupler according to the present embodiment may couple the second body 2 with the rotary adaptor 3 by using a magnetic force. Referring to FIG. 9, one or more first magnets 51 or one or more pairs of magnets are disposed in a corresponding recess portion of the second portion 31b of the accommodation portion 31 of the rotary adaptor 3. External surfaces of the first magnets 51 and non-recess portions of the second portion 31b may form a bottom surface 33 of the accommodation portion 31 to face the second body 2. One or more magnets 52 or one or more pairs of magnets are disposed in, for example, a corresponding recess portion of the side surface 20b, for example, the side surface 20b of the long side portion 21 of the second body 2. External surface of the second magnets 52 and non-recess portions of the side surface 20b may form an external surface (appearance) of the second body 2. The first magnets 51 and the second magnets 52 may have opposite polarities. For example, the first magnets 51 may be an N pole (N polarity) and the second magnets 52 may be an S pole (S polarity).

When no cover is disposed on the first magnets 51 or the second magnets 52, the first magnet 51 or the second magnets 52 may be exposed to an outside of the second portion 31b of the rotary adaptor 3 or the side surface 20b of the second body 2.

It is possible that when a cover (not illustrated) may be disposed on the external surfaces of the first magnets 51 and/or non-recessed portions of the second portion 31b, an external surface of the cover may form a bottom surface 33 of the accommodation portion 31 to face the second body 2. It is also possible that when a cover may be disposed on the external surfaces of the second magnets 52 and/or the non-recess portions of the side surface 20b of the second body 2, an external surface of the cover may form the external surface of the side portion 20b.

It is possible that one of the first magnets 51 and the second magnets 52 can be a permanent magnet and the other one of the first magnets 51 and the second magnets 52 may be an electromagnet to generate a force with the permanent magnet. It is also possible that the first magnets 51 and the second magnets 52 can be either one of a permanent magnet and an electromagnet.

When the long side portion 21 of the second body 2 is inserted into the accommodation portion 31, the second body 2 may be coupled with the rotary adaptor 3 by using a magnetic attractive force between the first magnets 51 and the corresponding second magnets 52. By using the coupler based on a magnetic force, when the second body 2 is disposed as indicated by dotted lines in FIG. 10, or when the second body 2 is inserted into the rotary adaptor 3 from a position indicated as the dotted lines of FIG. 10, even though the second body 2 is not aligned with but deviated from the rotary adaptor 3, the second body 2 is moved to a coupling position or a fit position so that the second magnets 52 may respectively face the corresponding first magnets 51 due to the magnetic attractive force between the first magnets 51 and the second magnets 52. Thus, the second body 2 and the first body 1 may be aligned with each other, as indicated by a solid line in FIG. 10.

Figure 11:
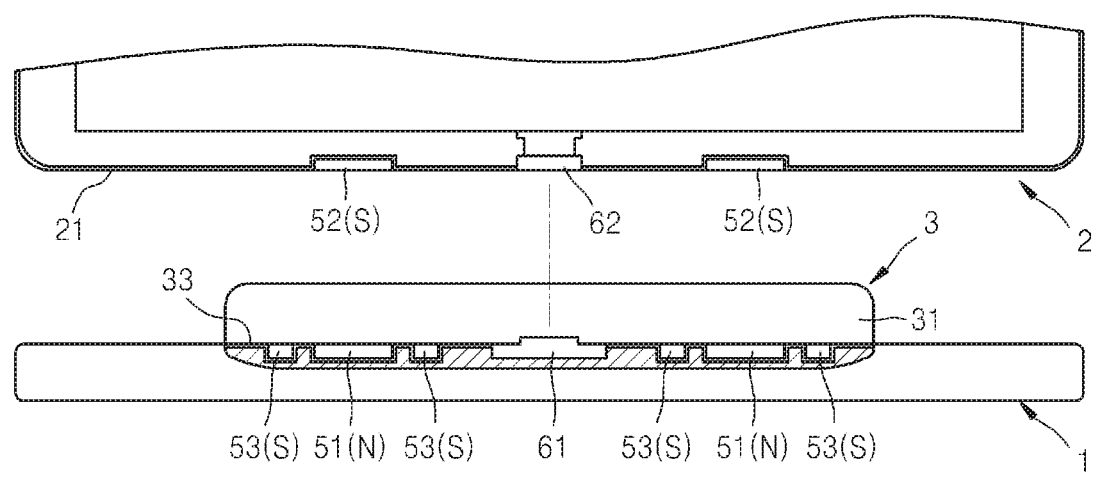
FIG. 11 is a cross-sectional view illustrating a coupler to couple a second body with a rotary adaptor by using a magnetic force, according to an embodiment of the present general inventive concept.

The rotary adaptor 3 may further include third magnets 53 to additionally provide the secure alignment and coupling of the first body 1 and the second body 2. The third magnets 53 may be disposed on the second body 2 or the rotary adaptor 3. For example, FIG. 11 illustrates a coupler in a case where the third magnets 53 are disposed on the rotary adaptor 3. In this case, the third magnets 53 may have the same polarity as the second magnets 52. For example, in FIG. 11, the third magnets 53 may each correspond to the S pole. The third magnets 53 may be disposed at one side or two sides of each of the first magnets 51. Although not illustrated, the third magnets 53 may be disposed on the second body 2. In this case, the third magnets 53 may correspond to the same polarity as the polarity of the first magnets 51, for example, the N pole. In addition, the third magnets 53 may be disposed at one side or two sides of each of the second magnets 52.

Figure 10:
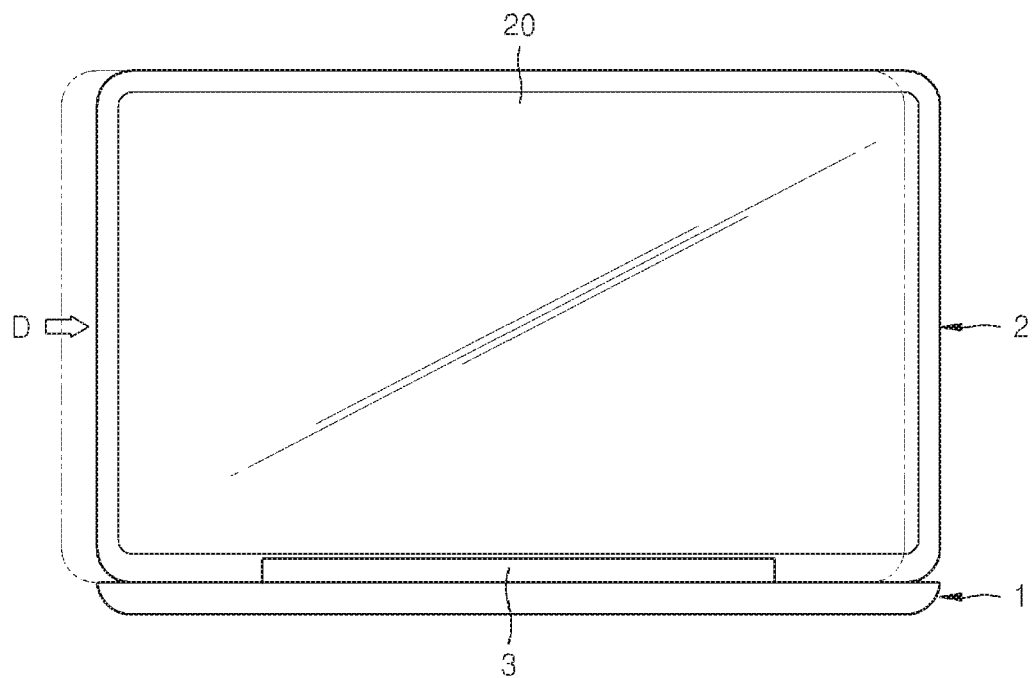
FIG. 10 is a diagram illustrating a mobile apparatus in a state where a second body is aligned with a first body by using a magnetic force, according to an embodiment of the present genera inventive concept.

As indicated by dotted lines in FIG. 10, when the second body 2 is inserted into the accommodation portion 31 of the rotary adaptor 3, the second magnets 52 is inserted adjacent to, for example, the third magnets 53 rather than being respectively aligned with the first magnets 51. In this case, since the third magnets 53 and the second magnets 52 have the same polarity, a magnetic repulsive force acts between the third magnets 53 and the second magnets 52. Due to the magnetic repulsive force, the second body 2 is moved in an arrow direction D. When the second body 2 is moved in the arrow direction B due to the magnetic repulsive force, the second body 2 is attracted in the arrow direction D due to the magnetic attractive force between the first magnets 51 and the second magnets 52, and the first magnets 51 and the second magnets 52 may be aligned with each other so as to face each other. In addition, as indicated by the solid line of FIG. 10, a state in which the second body 2 may be aligned with the first body 1 may be maintained due to the magnetic attractive force between the first magnets 51 and the second magnets 52.

FIGS. 9 and 11 illustrate a coupler having a pair of first magnets 51 and a pair of second magnets 52 corresponding thereto. However, the present general inventive concept is not limited thereto. If necessary, three or more first magnets 51 and three or more second magnets 52 may be used.

In order to insert the short side portion 22 of the second body 2 into the rotary adaptor 3, as illustrated in FIG. 6, the second magnets 52 may also be disposed on the short side portion 22 in a similar way to FIGS. 9 and 11.

At least one of the first magnet 51 and the second magnet 52 may be an electromagnet. A function of the electromagnet may be on or off by shutting on or off an electrical signal to be applied thereto. When the second body 2 is mounted on the rotary adaptor 3, a function of the electromagnet is on. When the second body 2 is detached from the rotary adaptor 3, the magnetic attractive force between the first magnets 51 and the second magnets 52 may be removed by turning off the function of the electromagnet. Thus, the second body 2 may be easily detached from the rotary adaptor 3 by using a weak force. In order to turning on or off the function of the electromagnet, the second body 2 may have a switch 54 and the first body 1 may have a switch 55 (see FIGS. 1-4) may be disposed on at least one of the first body 1 and the second body 2. For example, the switch 54 or 55 (see FIG. 1) may shut off power supplied from a battery installed in the first body 1 or the second body 2 to the first magnets 51 or the second magnets 52 to turn off the functions of the first magnets 51 or the second magnets 52. In addition, the switch 54 or 55 may supply power from the battery installed in the first body 1 or the second body 2 to the first magnets 51 or the second magnets 52 so that the first magnets 51 or the second magnets 52 may have opposite polarities to the second magnets 52 or the first magnets 51, and thus, the magnetic attractive force between the first magnets 51 and the second magnets 52 may be generated or removed.

Figure 12:
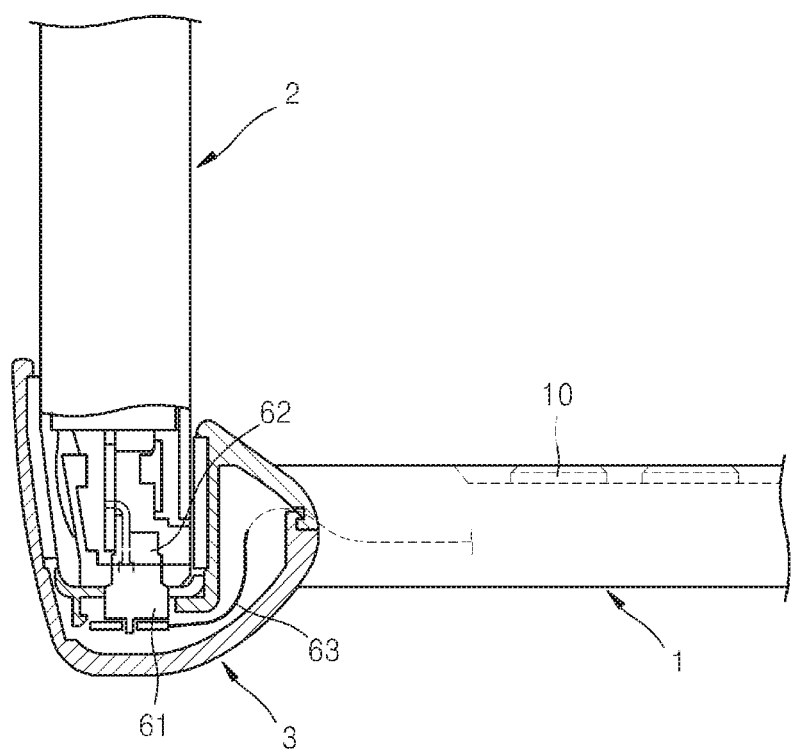
FIG. 12 is a side cross-sectional view illustrating a mobile apparatus having first and second electric contact portions, according to an embodiment of the present general inventive concept.

The second body 2 may be electrically connected to the first body 1 when being mounted on the rotary adaptor 3. To this end, as illustrated in FIGS. 9, 11, and 12, a first electric contact portion 61 may be disposed on the rotary adaptor 3 and a second electric contact portion 62 may be disposed on the second body 2. For example, the first electric contact portion 61 may be disposed on the bottom surface 33 of the accommodation portion 31 of the rotary adaptor 3. Referring to FIGS. 6 and 12, the first electric contact portion 61 may be electrically connected to the first body 1 via an electric signal line 63 that extends inside the rotary adaptor 3 through a space between the rotary shaft 41 of the hinge portion 40 and the insertion inlet 32 of the rotary adaptor 3. As another example, the first electric contact portion 61 may be electrically connected to the first body 1 via the electric signal line 63 that extends inside the rotary adaptor 3 through a hollow portion (not illustrated) formed in the rotary shaft 41 of the hinge portion 40.

Accordingly, when the second body 2 is accommodated in the accommodation portion 31 of the rotary adaptor 3, and the first magnets 51 and the second magnets 52 are aligned with each other to face each other, the second body 2 is coupled with the rotary adaptor 3 due to a magnetic attractive force between the first magnets 51 and the second magnets 52, and the first electric contact portion 61 and the second electric contact portion 62 are electrically connected to each other. Thus, the first body 1 and the second body 2 are electrically connected to each other, and an electrical signal such as a power signal, a driving signal, a manipulation signal, an image signal, or the like may be transferred between the first body 1 and the second body 2. To this end, a power terminal, a manipulation signal terminal, a driving signal terminal, an image signal terminal, or the like may be formed on the first and second electric contact portions 61 and 62.

Corresponding terminals from among the above-described terminals need to be electrically connected to each other. However, as indicated by the dotted lines in FIG. 10, when the second body 2 is not aligned but deviated from the first body 1 and is accommodated on the accommodation portion 31 of the rotary adaptor 3, incongruent terminals from among the above-described terminals may be electrically connected to each other. To prevent this, referring to FIGS. 13 and 14, protrusions 71 may protrude from the long side portion 21 of the second body 2 and supports 72 may be formed on the accommodation portion 31 of the rotary adaptor 3 to correspond to the corresponding protrusions 71. For example, the supports 72 may correspond to the bottom surface 33 of the accommodation portion 31. Concave portions 73 into which the protrusions 71 are inserted may be formed in the supports 72. A protruding degree C. of each of the protrusions 71 may be appropriately determined so that the second electric contact portion 62 may be spaced apart from the first electric contact portion 61.

Figure 13:
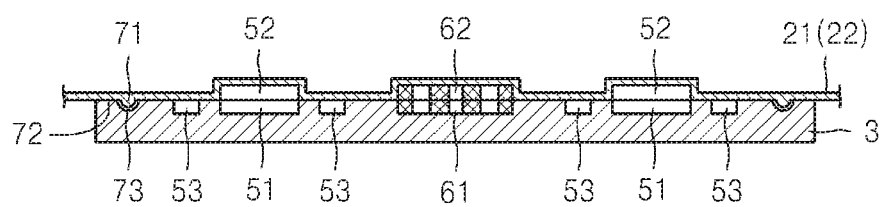
FIGS. 13 and 14 are cross-sectional views illustrating a coupling state of a mobile apparatus having protrusions, supports, and concave portions, according to an embodiment of the present general inventive concept.
Figure 14:
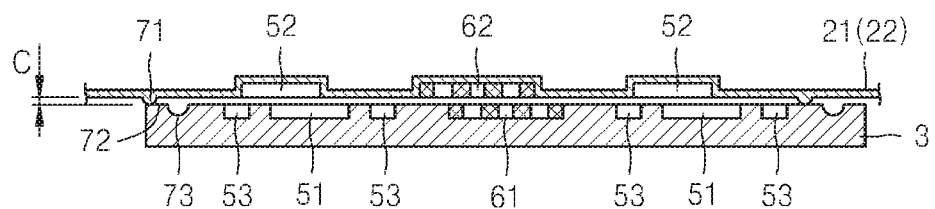

Due to this structure, referring to FIG. 14, when the second body 2 is disposed to be inserted into the accommodation portion 31 and is deviated from the first body 1, the protrusions 71 are supported by the supports 72 and the second electric contact portion 62 is spaced apart from the first electric contact portion 61 upward, and thus, the first electric contact portion 61 and the second electric contact portion 62 are separated from each other. In addition, when the second body 2 is moved in the arrow direction D (FIG. 10) due to the magnetic repulsive force between the third magnets 53 and the second magnets 52 so that the first magnets 51 and the second magnets 52 may face each other, the protrusions 71 face the concave portions 73 and the second body 2 is moved downward so that the protrusions 71 is inserted into the concave portions 73, and terminals having the same function of the first electric contact portion 61 and the second electric contact portion 62 may be connected to each other, as illustrated in FIG. 13.

Since a pair of first magnets 51 and a pair of second magnets 52 are disposed at both sides of the first electric contact portion 61 and both sides of the second electric contact portion 62, respectively, the coupling force of the first magnets 51 and the second magnets 52 provides the stability of the electrical connection between the first electric contact portion 61 and the second electric contact portion 62.

As illustrated in FIG. 6, in order to insert the short side portion 22 of the second body 2 into the second body 2, although not illustrated, the second electric contact portion 62 and the protrusions 71 may also be formed on the short side portion 22 of the second body 2.

In the above-described embodiment, the protrusions 71 are disposed on the second body 2 and the supports 72 and the concave portions 73 are disposed on the rotary adaptor 3. However, the present general inventive concept is not limited thereto. The protrusions 71 may be disposed on the rotary adaptor 3 and the supports 72 and the concave portions 73 may be disposed on the second body 2.

The protrusions 71, the supports 72, and the concave portions 73 may perform a valuable function of aligning the second body 2 and the first body 1 with each other without the first and second electric contact portions 61 and 62. When the second body 2 is deviated from the first body 1 and is inserted into the accommodation portion 31 of the rotary adaptor 3, the protrusions 71 is supported by the supports 72, thereby reducing friction between the second body 2 and the rotary adaptor 3. Thus, the second body 2 may be easily moved to an alignment position where the first magnets 51 and the second magnets 52 face each other due to a magnetic repulsive force between the third magnets 53 and the first magnets 51 or the second magnets 52. In addition, the second body 2 may be moved to a position where the protrusions 71 are inserted into the concave portions 73 due to a magnetic repulsive force between the third magnets 53 and the first magnets 51 or the second magnets 52. Thus, together with magnetic forces of the first magnets 51 and the second magnets 52, the protrusions 71 and the concave portions 73 may maintain the alignment of the second body 2.

Referring to FIGS. 3 and 4, the second body 2 may also be coupled with the rotary adaptor 3 when rotating with respect to the first body 1 at 180 degrees in the direction A of FIG. 1. In this case, the first and second electric contact portions 61 and 62 may have structures to be electrically connected to each other also when the second body 2 rotates at 180 degrees. To this end, one of the first and second electric contact portions 61 and 62 may include two terminals having symmetrical structures.

Figure 15:
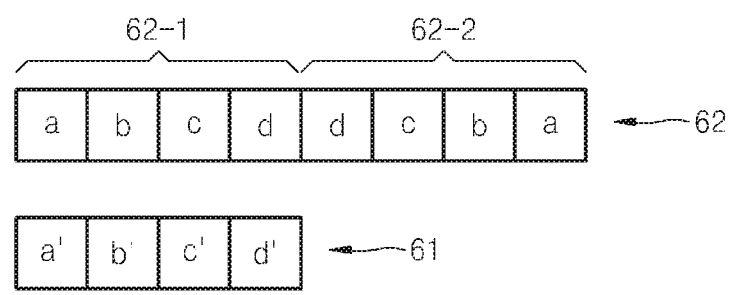
FIGS. 15 and 16 are diagrams illustrating a mobile apparatus having first and second electric contact portions having symmetrical terminal arrangements according to an embodiment of the present general inventive concept

Referring to FIG. 15, the second electric contact portion 62 includes a first terminal unit 62-1 and a second terminal unit 62-2, which have symmetrical terminal arrangements. Due to this structure, for example, when the second body 2 is coupled with the rotary adaptor 3, as illustrated in FIG. 3, the first terminal unit 62-1 is coupled with the first electric contact portion 61. In addition, when the second body 2 rotates at 180 degrees in the directions A and/or C and is coupled with the rotary adaptor 3, as illustrated in FIG. 4, the second terminal unit 62-2 is coupled with the first electric contact portion 61. Thus, a-a', b-b', c-c', and d-d' terminals of the first electric contact portion 61 and the second electric contact portion 62 may be connected to each other in either one of coupling states of FIGS. 3 and 4.

Figure 16:
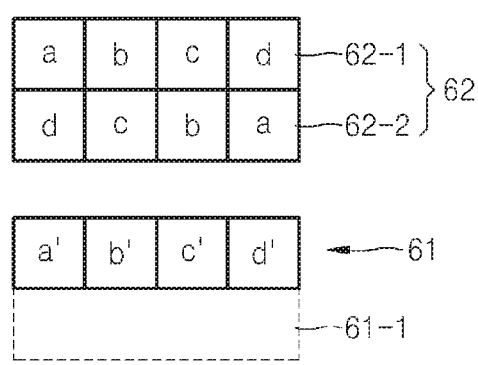

The first and second terminal units 62-1 and 62-2 may be arranged like in FIG. 16. In this case, when the second body 2 is coupled with the rotary adaptor 3, as illustrated in FIG. 3, the first terminal unit 62-1 is connected to the first electric contact portion 61 and the second terminal unit 62-2 faces a dummy portion 61-1. In addition, when the second body 2 rotates by 180 degrees in the direction D and is coupled with the rotary adaptor 3, as illustrated in FIG. 4, the second terminal unit 62-2 is connected to the first electric contact portion 61 and the first terminal unit 62-1 face the dummy portion 61-1. Thus, a-a', b-b', c-c', and d-d' terminals of the first electric contact portion 61 and the second electric contact portion 62 may be connected to each other in either one of coupling states of FIGS. 3 and 4.

Figure 17:
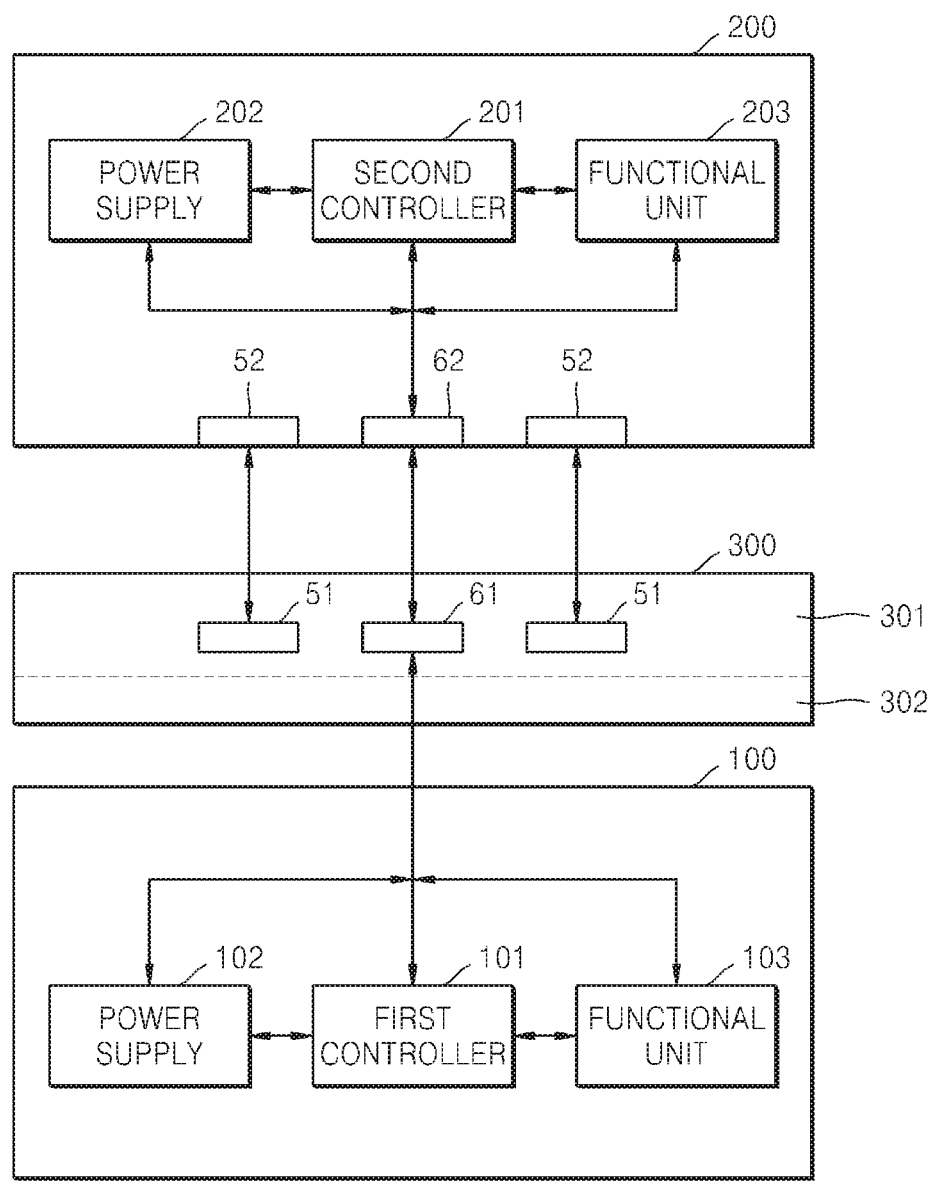
FIG. 17 is a block diagram illustrating a mobile apparatus according to an embodiment of the present general inventive concept.

As illustrated in FIG. 17, a mobile apparatus may include a first body 100, a second body 200, and a rotary adaptor 300. The first body 100 of FIG. 17 is similar to or same as the first body 1 illustrated in FIGS. 1 through 16, the second body of FIG. 17 is similar to or same as the second body 2 illustrated in FIGS. 1 through 16, and the rotary adaptor 300 of FIG. 17 is similar to or same as the rotary adaptor 3 illustrated in FIGS. 1 through 16. Accordingly, detail descriptions thereof will not be repeated but omitted.

Also illustrated in FIG. 17, the first body 100 may include a first controller (one or more processors) 101, a power supply 102 to receive power from an external apparatus, store the power, and supply the received power or the stored power to components of the first body 100 and/or the second body 200, and a functional unit 103 including the keyboard 10 and pointing device 11 of FIG. 1 to input, output, process, receive and transmit a command and data to perform functions of the mobile apparatus.

The rotary adaptor 300 may include an accommodation portion 301 having first magnets 51 and electric contact portion 61 to correspond to the accommodation portion 31 of the rotary adaptor 3. The rotary adaptor 300 may also have an insertion inlet 302 to correspond to the insertion inlet 32 to rotatably couple the second body 200 to the first body 100.

The second body 200 may include a second controller (one or more processors) 201, a power supply 202 to receive power from an external apparatus or the first body 100 through the electric contact portions 61 and 62, store the power, and supply the received power or the stored power to components of the first body 100 and/or the second body 200, and a functional unit 203 including the display unit 20 of FIG. 1 to input, output, process, transmit and receive a command and data to perform functions of the mobile apparatus.

It is possible that the first body 100 may controls the second body 200 and the second body 200 may controls the first body 100, according to a command or data generated and transmitted through the electric contact portions 61 and 62.

Although FIG. 17 illustrates the electric contact portion 62 and the second magnets 52 which can be installed on one side portion of a frame of the second body 200, it is possible that another electric contact portion and another magnets can be installed on the other side portion of the frame of the second body. In this case, the two sets of the electric contact portions 62 can be electrically connected to the second controller 201, the power supply 202, ad/or the functional unit 203 to perform the function of the mobile apparatus. At least one set of electric contact portions 62 is in an active mode to be electrically connected between the first body 100 and the second body 200.

A notebook computer and a tablet computer are described as an example of the mobile apparatus according to the above-described embodiments of the present general inventive concept. However, the present general inventive concept is not limited thereto. For example, the mobile apparatus may be used in a game machine, a communication terminal, a multimedia device to produce image information or image information and audible information, or the like.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An electronic apparatus, comprising:
   a first body including a keyboard, an adaptor and a first magnet;
   a second body including a display, a frame in which the display is installed and a second magnet corresponding to the first magnet so that the first body is magnetically attachable to or detachable from the adaptor,
   wherein the second body is rotatable with respect to the keyboard of the first body while the first body is attached to the second body.

2. The electronic apparatus of claim 1, wherein:
   the first magnet having a first magnetic structure and a second magnetic structure; and
   the first body further comprises a first electric contact portion disposed between the first magnetic structure and the second magnetic structure.

3. The electronic apparatus of claim 2, wherein:
   the second magnet having a third magnetic structure disposed to magnetically attract the first magnetic structure and a fourth magnetic structure disposed to magnetically attract the second magnetic structure to attach the first body to the second body; and a second electric contact portion disposed to be in contact with the first electric contact portion when the first body is attached to the second body.

4. The electronic apparatus of claim 3, wherein:
the second magnet is disposed in the one side of the frame; and
the second magnet comprises at least one magnet having a length longer than a thickness of the one side of the frame.

5. The electronic apparatus of claim 1, wherein:
the first body includes protrusions; and
the frame includes recesses at one side of the frame to receive the protrusions.

6. The electronic apparatus of claim 2, wherein:
the first magnetic structure having:
   a first magnet element having a first magnetic polarity;
   a second magnet element having the first magnetic polarity; and
   a third magnet element between the first magnet element and the second magnet element, the third magnet element having a second magnetic polarity opposite to the first magnetic polarity;
the third magnetic structure having a fourth magnet element having the first magnetic polarity; and
the first and third magnetic structures are configured with respect to each other so that the third magnet element of the first magnetic structure and the fourth magnet element of the third magnetic structure attract each other, the first magnet element of the first magnetic structure repels the fourth magnet element of the third magnetic structure, and the second magnet element of the first magnetic structure repels the fourth magnet element of the third magnetic structure, to align the fourth magnet element of the third magnetic structure with the third magnet element of the first magnetic structure, to thereby couple the first and second bodies together.

7. The electronic apparatus of claim 6, wherein a size of each of the first magnet element and the second magnet element are smaller than a size of the third magnet element.

8. The electronic apparatus of claim 6, wherein:
the second magnetic structure having:
   a fifth magnet element having the first magnetic polarity;
   a sixth magnet element having the first magnetic polarity; and
   a seventh magnet element between the fifth magnet element and the sixth magnet element, and having the second magnetic polarity;
the fourth magnetic structure having:
   an eighth magnet element having the first magnetic polarity; and
the second and fourth magnetic structures, and the first and second electric contact portions, are configured with respect to each other so that the seventh magnet element of the second magnetic structure and the eighth magnet element of the fourth magnetic structure attract each other, and the fifth magnet element of the second magnetic structure repels the eighth magnet element of the fourth magnetic structure, and the sixth magnet element of the second magnetic structure repels the eighth magnet element of the fourth magnetic structure, to align the eighth magnet element of the fourth magnetic structure with the seventh magnet element of the second magnetic structure, to thereby couple the first and second bodies together with the first electric contact portion connected to the second electric contact portion.

9. The electronic apparatus of claim 8, wherein a size of each of the fifth magnet element and the sixth magnet element are smaller than a size of the seventh magnet element.

10. The electronic apparatus of claim 6, wherein the first magnetic polarity is N, and the second magnetic polarity is S.

11. The electronic apparatus of claim 6, wherein the first magnetic polarity is S, and the second magnetic polarity is N.

12. The electronic apparatus of claim 1, wherein the adaptor supports the second body in a plurality of positions with respect to the first body.

13. The electronic apparatus of claim 12, wherein the plurality of positions comprises a folded position or an unfolded position.

14. The electronic apparatus of claim 1, wherein the first body comprises:
a wireless communicator to wirelessly transmit the input received via the input device to the second body or an external electronic device.

15. The electronic apparatus of claim 1, wherein the second body comprises a power controller adapted to supply an electrical power to the first body.

16. A mobile apparatus detachably mountable to an adaptor on an external device, the adaptor configured to rotate with respect to the external device and having protrusions, the mobile apparatus comprising:
a display; and
a frame in which the display is installed,
wherein:
   the adaptor includes a first magnet;
   the mobile apparatus includes a second magnet corresponding to the first magnet so that the mobile apparatus is magnetically attachable to or detachable from the adaptor; and
   the mobile apparatus is rotatable with respect to the external device while the mobile apparatus is attached to the external device.

17. The mobile apparatus of claim 16, wherein the frame having recesses at one side of the frame to receive the protrusions of the adaptor.

18. The mobile apparatus of claim 16, wherein:
the first magnet having a first magnetic structure and a second magnetic structure; and
the adaptor further includes a first electric contact portion disposed between the first magnetic structure and the second magnetic structure.

19. The mobile apparatus of claim 18, wherein:
the second magnet having:
   a third magnetic structure disposed to magnetically attract the first magnetic structure; and
   a fourth magnetic structure disposed to magnetically attract the second magnetic structure to attach the first body to the second body; and
the mobile apparatus further includes a second electric contact portion disposed to be in contact with the first electric contact portion when the mobile apparatus is attached to the external device.

20. The mobile apparatus of claim 19, wherein:
the first magnetic structure having:
   a first magnet element having a first magnetic polarity;

a second magnet element having the first magnetic polarity; and a third magnet element between the first magnet element and the second magnet element, the third magnet element having a second magnetic polarity opposite to the first magnetic polarity;

the third magnetic structure having a fourth magnet element having the first magnetic polarity; and the first and third magnetic structures are configured with respect to each other so that the third magnet element of the first magnetic structure and the fourth magnet element of the third magnetic structure attract each other, the first magnet element of the first magnetic structure repels the fourth magnet element of the third magnetic structure, and the second magnet element of the first magnetic structure repels the fourth magnet element of the third magnetic structure, to align the fourth magnet element of the third magnetic structure with the third magnet element of the first magnetic structure, to thereby couple the mobile apparatus and the external device together.

21. The mobile apparatus of claim 20, wherein a size of each of the first magnet element and the second magnet element are smaller than a size of the third magnet element.

22. The mobile apparatus of claim 20, wherein:

the second magnetic structure having:

- a fifth magnet element having the first magnetic polarity;
- a sixth magnet element having the first magnetic polarity; and
- a seventh magnet element between the fifth magnet element and the sixth magnet element, the seventh magnet element having the second magnetic polarity;

the fourth magnetic structure having an eighth magnet element having the first magnetic polarity; and the second and fourth magnetic structures, and the first and second electric contact portions, are configured with respect to each other so that the seventh magnet element of the second magnetic structure and the eighth magnet element of the fourth magnetic structure attract each other, and the fifth magnet element of the second magnetic structure repels the eighth magnet element of the fourth magnetic structure, and the sixth magnet element of the second magnetic structure repels the eighth magnet element of the fourth magnetic structure, to align the eighth magnet element of the fourth magnetic structure with the seventh magnet element of the second magnetic structure, to thereby couple the mobile apparatus and the external device together with the first electric contact portion connected to the second electric contact portion.

23. The mobile apparatus of claim 22, wherein a size of each of the fifth magnet element and the sixth magnet element are smaller than a size of the seventh magnet element.

24. The mobile apparatus of claim 20, wherein the first magnetic polarity is N, and the second magnetic polarity is S.

25. The mobile apparatus of claim 20, wherein the first magnetic polarity is S, and the second magnetic polarity is N.

26. The mobile apparatus of claim 16, further comprising a power controller adapted to supply an electrical power to the external device.

* * * * *